(12) United States Patent
Kushion

(10) Patent No.: US 6,271,637 B1
(45) Date of Patent: Aug. 7, 2001

(54) DIAGNOSTIC SYSTEM FOR ELECTRIC MOTOR

(75) Inventor: Mark Dennis Kushion, Saginaw, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/500,764

(22) Filed: Feb. 8, 2000

Related U.S. Application Data
(60) Provisional application No. 60/154,608, filed on Sep. 17, 1999.

(51) Int. Cl.[7] .................................................... H02K 17/32
(52) U.S. Cl. ........................ 318/434; 318/433; 318/798; 318/799; 388/907.5
(58) Field of Search .................................... 318/798, 794, 318/433, 434; 388/907.5

(56) References Cited

U.S. PATENT DOCUMENTS

| | | | |
|---|---|---|---|
| 5,631,796 | * | 5/1997 | Yoshihara et al. .................... 318/139 |
| 5,780,980 | * | 7/1998 | Naito .................................... 318/139 |

* cited by examiner

Primary Examiner—Karen Masih
(74) Attorney, Agent, or Firm—Edmund P. Anderson

(57) ABSTRACT

A diagnostic system for electric motors, such as those used in automotive applications. The system comprises a controller for supplying a desired command current to said electric motor, a sensor for measuring the rotational speed of the motor, a sensor for measuring the actual current supplied to the motor by the controller, a diagnostic control unit adapted to receive the measured rotational speed, measured supplied voltage, and a command current level value as inputs. The diagnostic control unit further comprises circuitry to calculate an estimated actual current drawn by the motor and to signal an error condition if the estimated actual current is not within a calculated valid range.

7 Claims, 4 Drawing Sheets

DIAGNOSTIC SYSTEM FOR ELECTRIC MOTOR

PRIOR HISTORY

This application is based upon, and claims the benefit of, U.S. Provisional Patent Application No. 60/154,608, filed Sep. 17, 1999.

FIELD OF THE INVENTION

This invention relates to diagnostic systems.

BACKGROUND OF THE INVENTION

It is known to provide electric motors to provide power assisted steering in automobiles or other vehicles. Electric motors have various known advantages over traditional hydraulic power assist systems, among the most notable being significant energy savings at high engine RPMs. However, electric systems are also prone to failures that are unknown to hydraulic systems, such as short circuits and the like. What is needed is a diagnostic system that can monitor an electric power steering system, detect various electrical failures, and signal the failure to the operator.

BRIEF SUMMARY OF THE INVENTION

Common failure of electric motors used for automotive purposes include closed current feedback loop failures, motor phase-to-phase shorts, and open motor phases. In automotive applications, such as electric power assist, these failures show the common trait of exhibiting deviations from normal operating currents.

Disclosed herein is a system for measuring deviations from normal operating currents. There is provided a diagnostic control unit DCU that is preferably integrated with the motor's controller to form an Electronic Control Unit ECU on a single chip. The DCU takes as inputs the desired command current $I_{desired}$, the measured motor current $V_{fb}$ and the motor speed. This information is used to calculate a valid range of motor current. If the measured current falls out of this range, an error is signaled.

In a preferred embodiment, errors are accumulated on a counter and are not signaled until the counter exceeds a predetermined threshold.

DETAILED DESCRIPTION OF THE INVENTION

Figure 1:
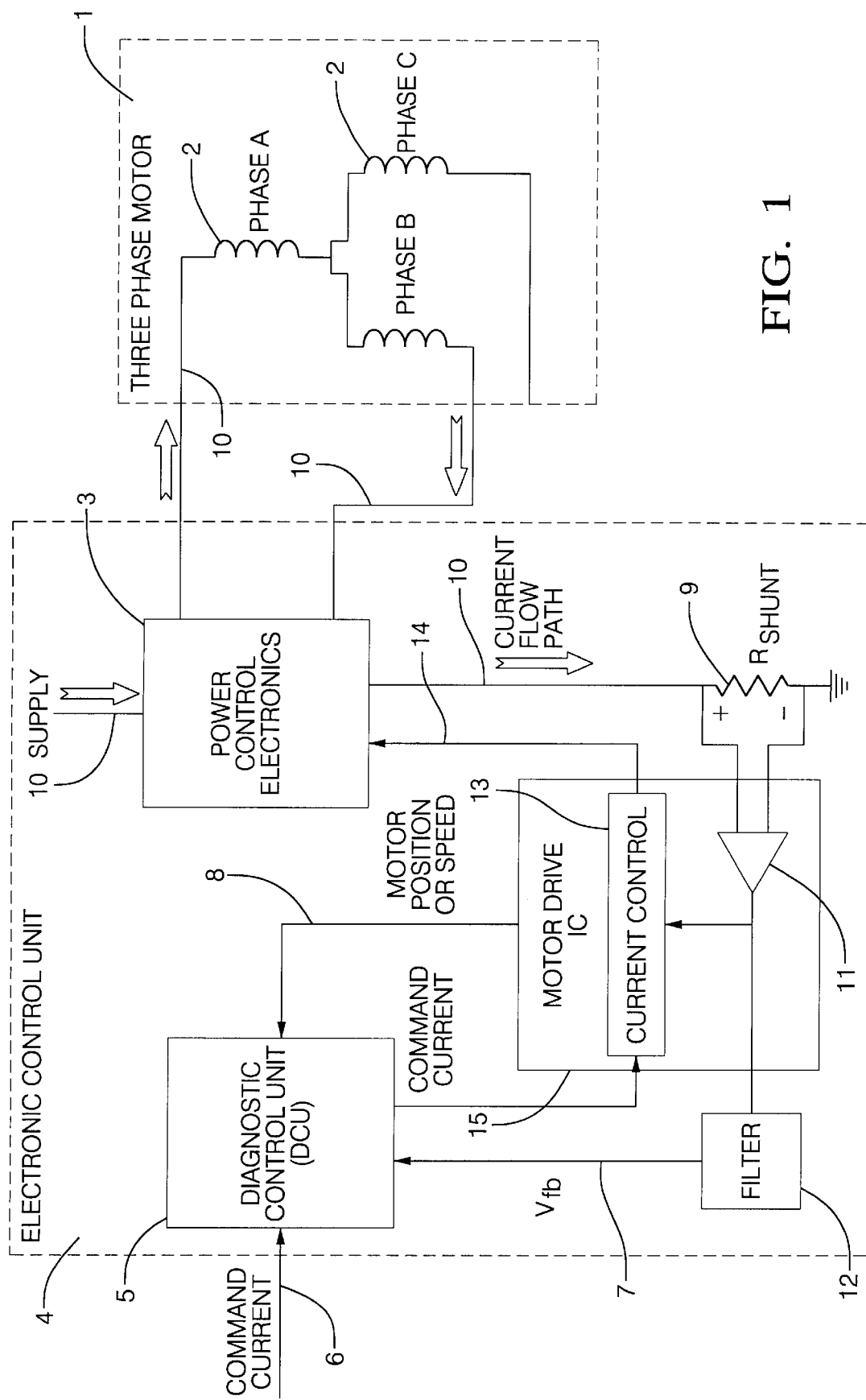
FIG. 1 is a schematic diagram of a preferred embodiment of the invention.

Referring to FIG. 1 there is schematically depicted an electric motor 1 having a plurality of windings 2 therein. The windings 2 are supplied voltage and current by a controller 3. In the preferred embodiment of this invention, the diagnostic apparatus described will be integrated with the controller 3 so as to comprise a single unit, preferably all on a single integrated circuit, referred to herein as the Electronic Control Unit (ECU) 4. A diagnostic control unit (DCU) 5 is provided to carry out the diagnostic functions of the invention. It is preferred that the diagnostic control unit 5 comprises a microprocessor because of the ease and flexibility of programming microprocessors to carry out computational and sequential functions and algorithms.

In order to carry out its functions, the diagnostic control unit (DCU) requires at least three pieces of information regarding the state of the electric motor 1. First, the DCU needs to know what current is desired for the motor. The desired current, $I_{desired}$, in a power steering system is signaled by whatever sensors or system is used to determine the level of assist needed by the driver of the vehicle. Recall that the torque delivered by any electric motor is directly proportional to the supplied current. Normally, the desired current, or "command current" is signaled directly to the controller 3, but for this invention the signal will instead be diverted to the DCU through an input channel 6. The desired command current $I_{desired}$, is preferably relayed to the Motor Drive IC 15. The Motor Drive IC 15 is responsible (in a functioning system) for controlling the actual current to the motor as commanded by the microprocessor. Also provided to the DCU will be a measurement 7 of the actual current supplied to the motor and a measurement 8 of the rotational speed of the motor. Alternatively, a measurement 8 of the rotor position may be inputted to the DCU, from which the rotor speed is easily calculated.

A preferred means of measuring actual current $I_{motor}$ is to provide a shunt resistor or impedance 9 in the main current flow path 10. The impedance 9 will preferably be extremely small so as to dissipate the most minimal amount of power from the motor. A comparator or Op-Amp 11 is provided to measure and amplify the small voltage drop across the shunt impedance 9 and its output 7 is inputted to the DCU as an analog voltage signal $V_{fb}$ that is directly proportional to the actual current $I_{motor}$ flowing through the motor. It is preferred that a filter 12 be provided to filter out the effects of high frequency ripples in the motor current.

The DCU 5 will be adapted to relay command current information to the controller 3 so the controller can use the information to drive the motor 1. This will preferably done through a current control module 13 that will preferably receive information regarding the present current from the comparator 11 so as to be able to supply a signal 14 to the controller 3 that will signal the controller as to how change the present current to match the desired command current.

The invention uses the information supplied to the DCU 5 to calculate an estimate of what the actual current flow $I_{motor}$ should be based upon the command current $I_{desired}$ and the motor speed. In a vehicle system, back EMF levels (function of motor speed) can limit the current flow through the motor (i.e., at high motor speeds, it may not be possible for the system to deliver the amount of current which is commanded by the microprocessor). Therefore, the DCU calculates an allowable range for the $V_{fb}$ signal (Maximum and minimum) based on command current and motor speed. Maximum and minimum ranges are established to account for system variations such as supply level and measurement tolerances.

Figure 2:
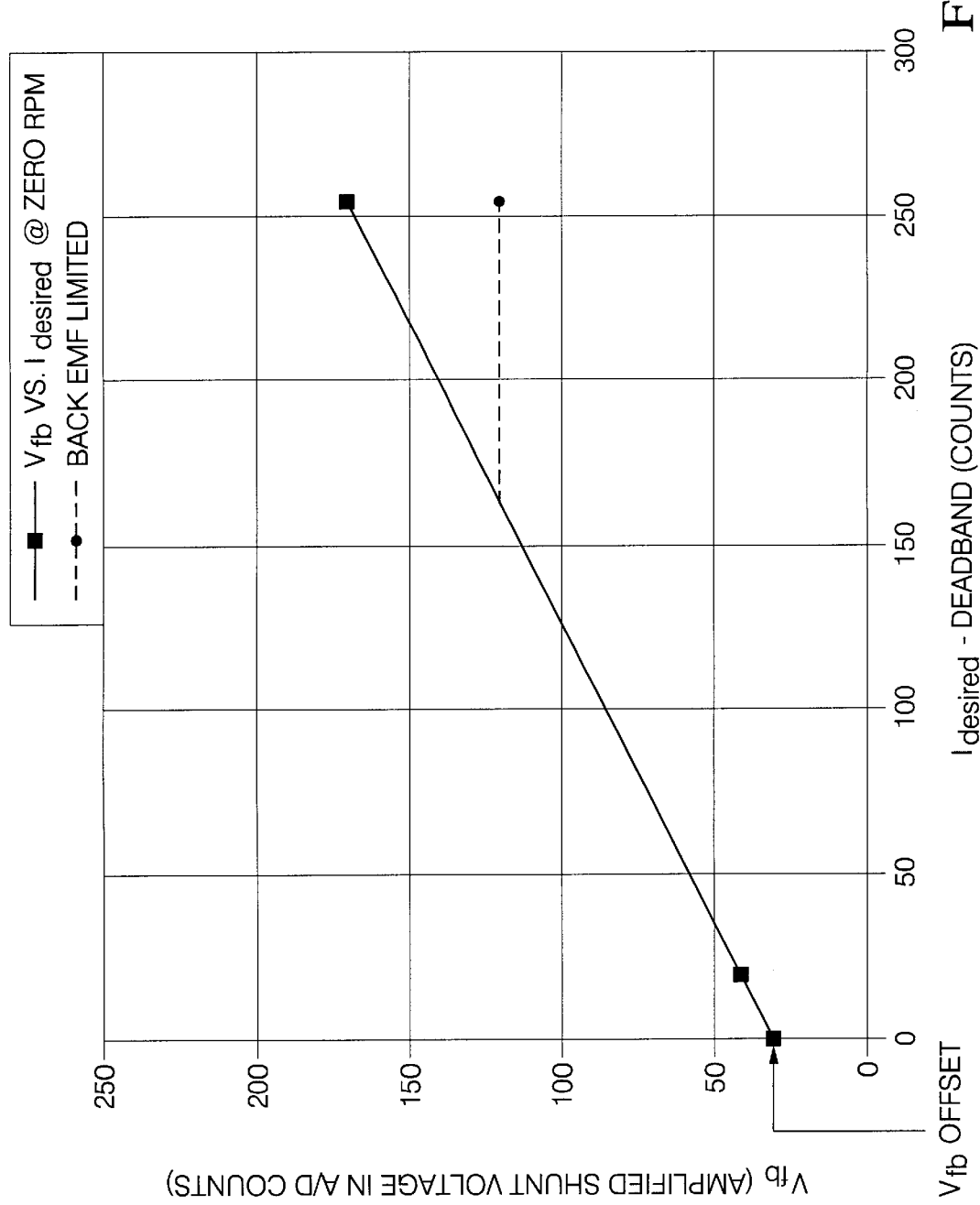
FIG. 2 is a graph of a typical relationship between the actual $V_{fb}$ versus desired current $I_{desired}$ supplied to an electric motor.

Referring to FIG. 2, there is shown a graph of a typical relationship between measured actual current represented by $V_{fb}$ and desired current $I_{desired}$ at zero motor speed. The horizontal axis shows $I_{desired}$ with deadband subtracted. Deadband refers to the minimum current needed to start the motor. Because the motor is not moving and therefore not generating any back-voltage, the graph shows that the measured actual current represented by $V_{fb}$ is linear and somewhat equal to $I_{desired}$, at least at low currents. The actual and command currents should be nearly equal to one another at zero motor speed. Maximum and minimum ranges are established (FIG. 3) to account for tolerances due to supply voltage, measurement error, etc. In addition, the ranges are as wide as possible to meet the safety requirements in order to maximize robustness to system variations and noise. Also shown in FIG. 2 is $V_{fb}$ Offset, which is the output of the comparator 11 and filter 12 at zero actual current $I_{motor}$. This value will vary from circuit to circuit and therefore must be supplied to, or measured by, the DCU.

Also shown in FIG. 2 is the effect of back-voltage on the relationship between measured actual current represented by $V_{fb}$ and command $I_{desired}$ current at non-zero RPM. This is shown by the dotted line, which indicates that at any RPM there will be a maximum value to current flowing through the motor.

Circuitry may hardwired to carry out the steps of the invention, but the availability, cost-effectiveness, and convenience of microprocessors (CPUs) make them the preferred means of carrying out the invention. Software would therefore be the most convenient way to calculate or retrieve the values shown in FIG. 3.

Figure 3:
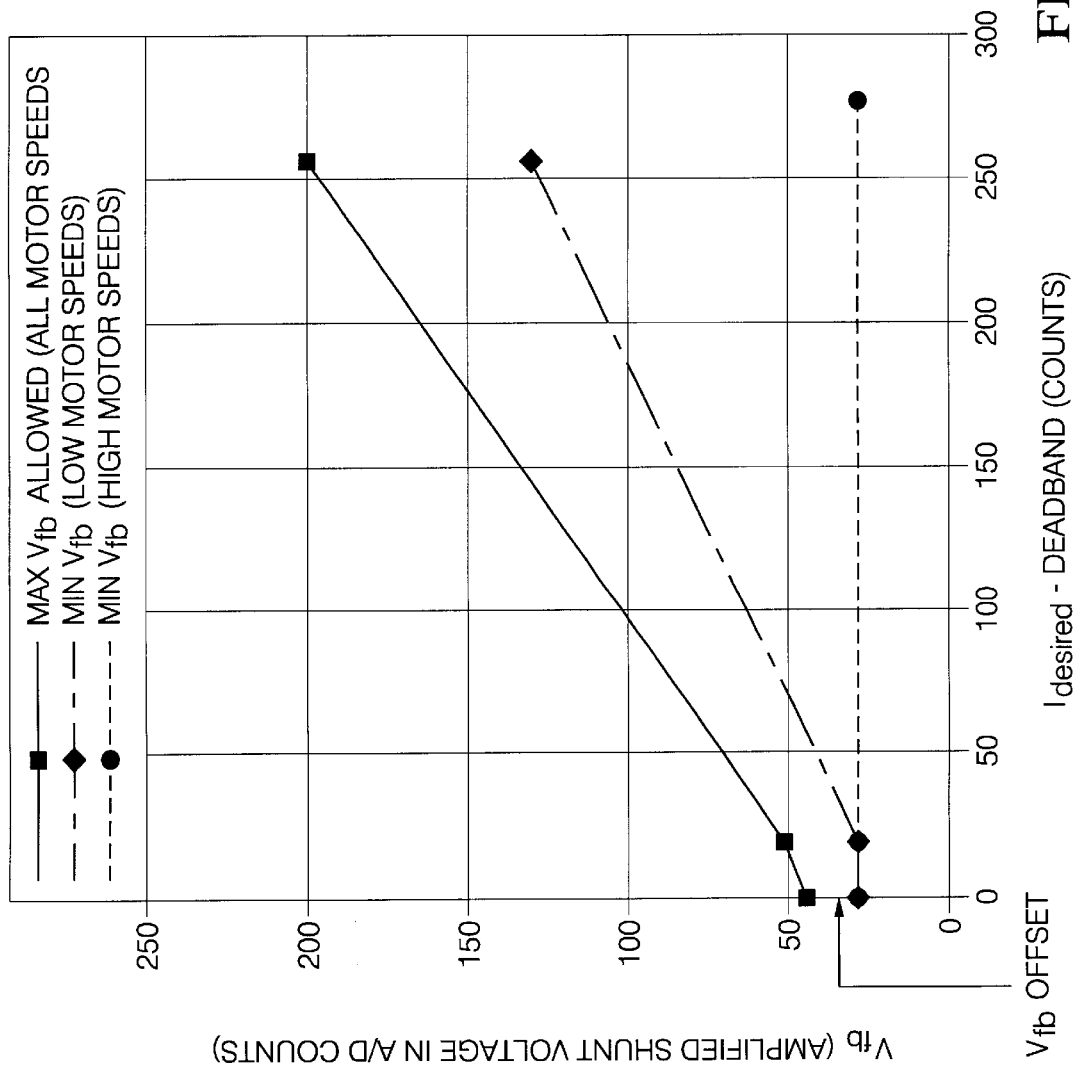
FIG. 3 is a representative graph of valid ranges of current supplied to an electric motor.

Referring to FIG. 3, there is depicted a graph of maximum and minimum acceptable levels of measured current represented by $V_{fb}$ based upon the command current $I_{desired}$ and motor speed. The minimum threshold is based on motor speed and drops with increasing speed. Both the maximum and minimum thresholds vary according to command current $I_{desired}$ at low motor speeds. At higher speeds, the minimum defaults to a constant value. Maximum limits may also be lowered as speed increases, however, this is not done in production. At high motor speeds, the diagnostic performance is limited and does not cover all conditions. This diagnostic is designed as a high-level "umbrella" diagnostic, which is intended to increase the overall diagnostic coverage of an entire set of algorithms and hardware. Failures at high motor speeds that result in a reversal of the input torque are detectable as the motor reverses direction (because FIG. 2 shows the absolute value of the command current). Measured currents between and inclusive of the thresholds are within the valid range of measured current.

Testing has shown that switching between two independent minimum curves, one for zero speed and one for average operational speed, may be sufficient for most purposes because the diagnostic functions of the present invention are primarily useful for detecting excess, rather than insufficient, current to the motor. Switching between two preset minimums would save computation time at the cost of some accuracy. The values can also be precomputed and recovered from a lookup table so as to save processor time.

Figure 4:
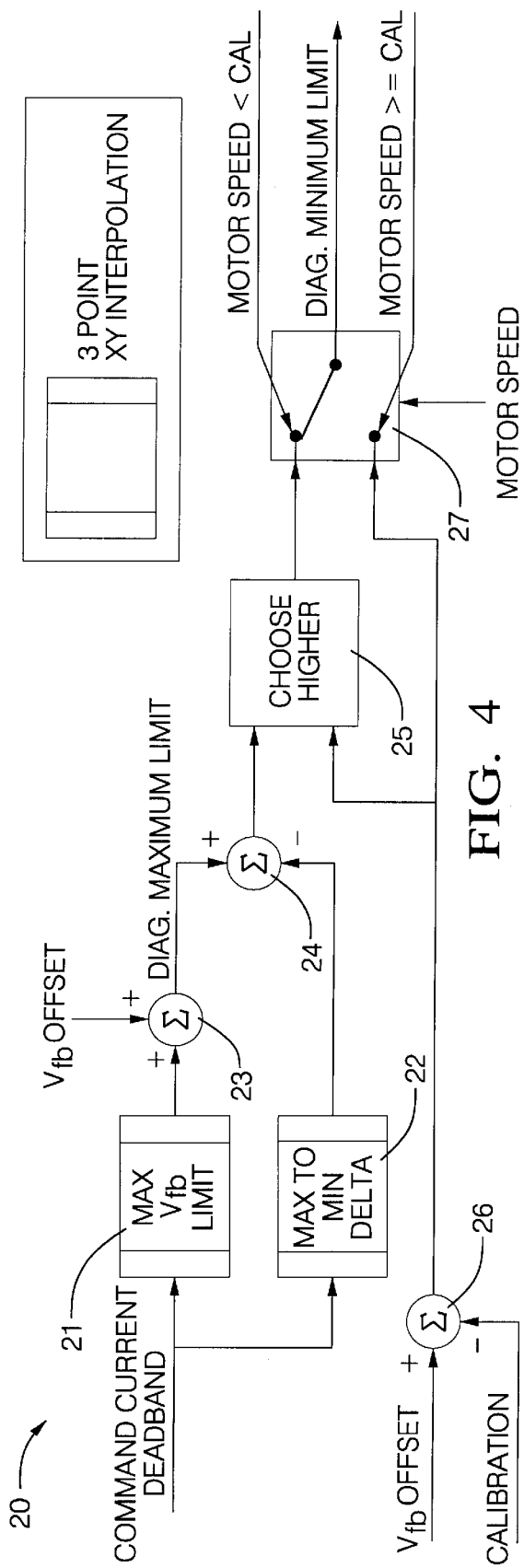
FIG. 4 is a flowchart of the method to calculate valid current ranges.

An algorithm for a limit calculator 20 for calculating the valid range of measured current represented by $V_{fb}$ is shown in FIG. 4. The circles 23, 24, 26 each represent the summation of the signals that are input to it. Squares 21, 22 represent lookup tables, which may be replaced by software functions serving the same purpose. For example, Diagnostic Maximum Limit is determined by adding the $V_{fb}$ Offset to the output of the Max $V_{fb}$ Limit Table 21 at circle 23. This means that the Maximum Limit shifts up and down with the $V_{fb}$ offset (particular from controller to controller) to account for tolerances.

Notice that at box 27 the algorithmic path that determines the Minimum Limit depends on whether the motor speed is below a calibrated speed or greater than or equal the calibrated speed. The calibration is done during program development and is a constant that resides in the program memory for all systems using the same motor/controller components. Items that affect the calibration include things such as physical properties of the motor that is selected for the application (such as the back-emf constant, the torque constant, the effects of motor performance over temperature, etc.). To determine the calibration value, we test the motor/controller system in the vehicle under various operating conditions, and review the data to select an RPM value for which the current measurement represented by ($V_{fb}$) is not largely affected by the motor speed (typically for electric power steering applications, this value is around 600–1000 RPM). Keep in mind that at speeds above this calibration, the minimum allowable current line becomes a constant for simplicity in implementation. The purpose of detecting measured current levels represented by ($V_{fb}$) which fall below the minimum line are to typically detect failures which may result in no output to the motor (examples include an open circuited motor phase, an open motor relay, etc.). Under these types of conditions, the motor speed drops quickly (to below the calibrated value) due to the reduction or loss of output current to the motor. When the motor speed drops, the measured actual current represented by $V_{fb}$ is measured as below the minimum line (at motor speeds less than the calibrated value) and a fault is logged.

The system could simply signal an error whenever the measured current $V_{fb}$ falls outside the valid range. The signal could be used by special circuitry to correct the situation or could simply be used to activate a dummy light on the dashboard to let the driver know the car needs servicing.

Figure 5:
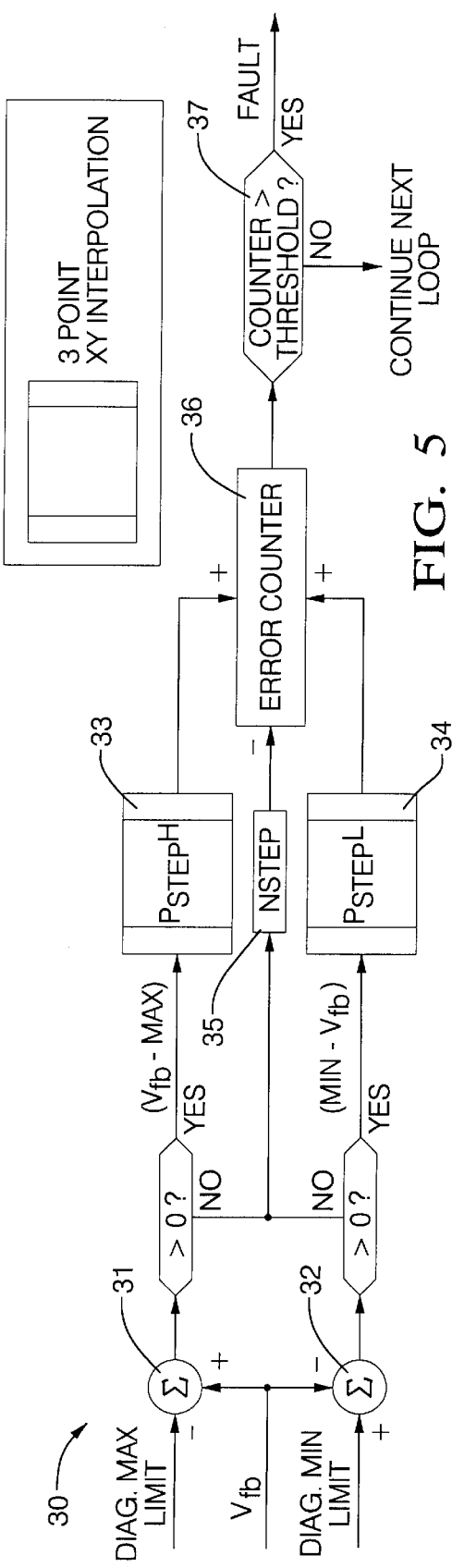
FIG. 5 is a flowchart of a method to accumulate errors in a counter.

However, it is preferred that mere transient measurements outside the valid range not trigger an error signal. Instead, as shown in FIG. 5, an algorithm for an error accumulator 30 is provided that increments an error counter 36 each time the measured current represented by $V_{fb}$ falls below or above the valid range. It is preferred that the error system be weighted such that large deviations from the valid range cause the counter 36 to increment more quickly. This is shown by the term ($V_{fb}$–Max) as the input to the PstepH table. As the measured current represented by ($V_{fb}$) gets much larger than the maximum limit (Max), the input to the table ($V_{fb}$–Max) gets larger. This results in a larger step value being output from the PstepH table. This value is added to the accumulator. The same technique is used for the current values below the minimum (i.e., Min>$V_{fb}$). Valid signal readings are picked up by a decrementer 35 that decrements the counter 36. If the counter exceeds a predetermined threshold at decision block 37, then the error signal is generated. By this means, only persistent and significant deviations appear as errors.

It is found that the diagnostic methods of the inventions are useful in detecting some of the more common current-related faults in electric motors, notably motor phase-to-phase shorts, open motor phases, and failures in the current feedback loop. The current feedback loop is the loop performed inside the Motor Drive IC 15. The motor drive IC (preferably through hardware logic) receives a commanded current limit from the microprocessor. Circuitry internal to the IC monitors the shunt voltage (measured current) and shuts off the FETs when the shunt voltage reaches the command limit. Failures in this loop cause loss of control over the output. For example, if the op-amp 11 output is shorted to ground, the motor drive IC would never see that the command current has been generated or measured across the shunt. The result of this failure would be that that the circuit provides maximum output current.

It will be understood that a person skilled in the art may make modifications to the preferred embodiment shown herein within the scope and intent of the claims. While the present invention has been described as carried out in specific embodiments thereof, it is not intended to be limited thereby, but rather is intended to cover the invention broadly within the scope and spirit of the claims.

What is claimed is:

1. A diagnostic system, comprising:
   an electric motor;
   a controller for supplying a desired command current to said electric motor;
   a sensor for measuring the rotational speed of said electric motor;
   a sensor for measuring an actual current supplied to said electric motor by said controller;
   a diagnostic control unit adapted to receive said measured rotational speed, a voltage representative of said actual current, and a command current level value; and
   wherein said diagnostic control unit further comprises circuitry to calculate a valid range of current drawn by said electric motor and to signal an error condition if said measured current is not within said calculated valid range.

2. The invention of claim 1 wherein said sensor for measuring said actual current to said motor comprises a shunt resistance.

3. The invention of claim 1, wherein said circuitry of said diagnostic control unit further comprises a microprocessor.

4. The invention of claim 3 further comprising:
   a lookup table having maximum and minimum acceptable values of motor current stored therein, said maximum and minimum values defining said valid range; and
   wherein said calculation of said valid range comprises retrieving said maximum and minimum values from said lookup table.

5. The invention of claim 1 further comprising a counter adapted to increment a count upon each instance of said error signal and to generate an accumulative error signal upon said count exceeding a predetermined threshold value.

6. The invention of claim 5 wherein said counter is decremented each time said voltage returns within said valid range after having been detected outside said valid range.

7. The invention of claim 5 wherein said incrementation is weighted to a magnitude of a deviation of said measured current from said valid range.

* * * * *